United States Patent
Arai et al.

(10) Patent No.: US 6,666,960 B2
(45) Date of Patent: Dec. 23, 2003

(54) ELECTROPLATING CURRENT SUPPLY SYSTEM

(75) Inventors: Toru Arai, Kyoto (JP); Makoto Sakurada, Yao (JP); Yoshiyuki Nishioka, Sakai (JP)

(73) Assignee: Sansha Electric Manufacturing Company, Limited, Osaka (JP)

( * ) Notice: Subject to any disclaimer, the term of this patent is extended or adjusted under 35 U.S.C. 154(b) by 8 days.

(21) Appl. No.: 10/061,600

(22) Filed: Feb. 1, 2002

(65) Prior Publication Data

US 2002/0104755 A1 Aug. 8, 2002

(30) Foreign Application Priority Data

Feb. 5, 2001 (JP) ........................... 2001-028680

(51) Int. Cl.[7] ............... B23H 7/14; C25B 15/00; C25B 9/00; C25B 9/04
(52) U.S. Cl. .............. 204/230.2; 204/230.5; 204/230.6; 204/230.8
(58) Field of Search ............... 204/230.2, 230.3, 204/230.5, 230.6, 230.8; 205/103, 107

(56) References Cited

U.S. PATENT DOCUMENTS

| | | | | |
|---|---|---|---|---|
| 4,666,567 A | * | 5/1987 | Loch | 205/83 |
| 6,099,711 A | * | 8/2000 | Dahms et al. | 205/101 |
| 6,511,591 B1 | * | 1/2003 | Virtanen et al. | 205/574 |

FOREIGN PATENT DOCUMENTS

JP  2000-92841 A  3/2000

* cited by examiner

*Primary Examiner*—Roy King
*Assistant Examiner*—Wesley A. Nicolas

(57) ABSTRACT

An electroplating current supply system includes a power supply unit for supplying an object to be plated (4) with an electroplating current whose polarity is inverted at predetermined intervals. The power supply unit includes a first DC power supply (3A) supplying a positive current and a second power supply (3B) supplying a negative current. The system includes further a processing unit (58) for controlling the ratio in magnitude and duration of the positive current (I2) to the negative current (I1) supplied to the object so as to plate the object with a uniform coating.

9 Claims, 4 Drawing Sheets

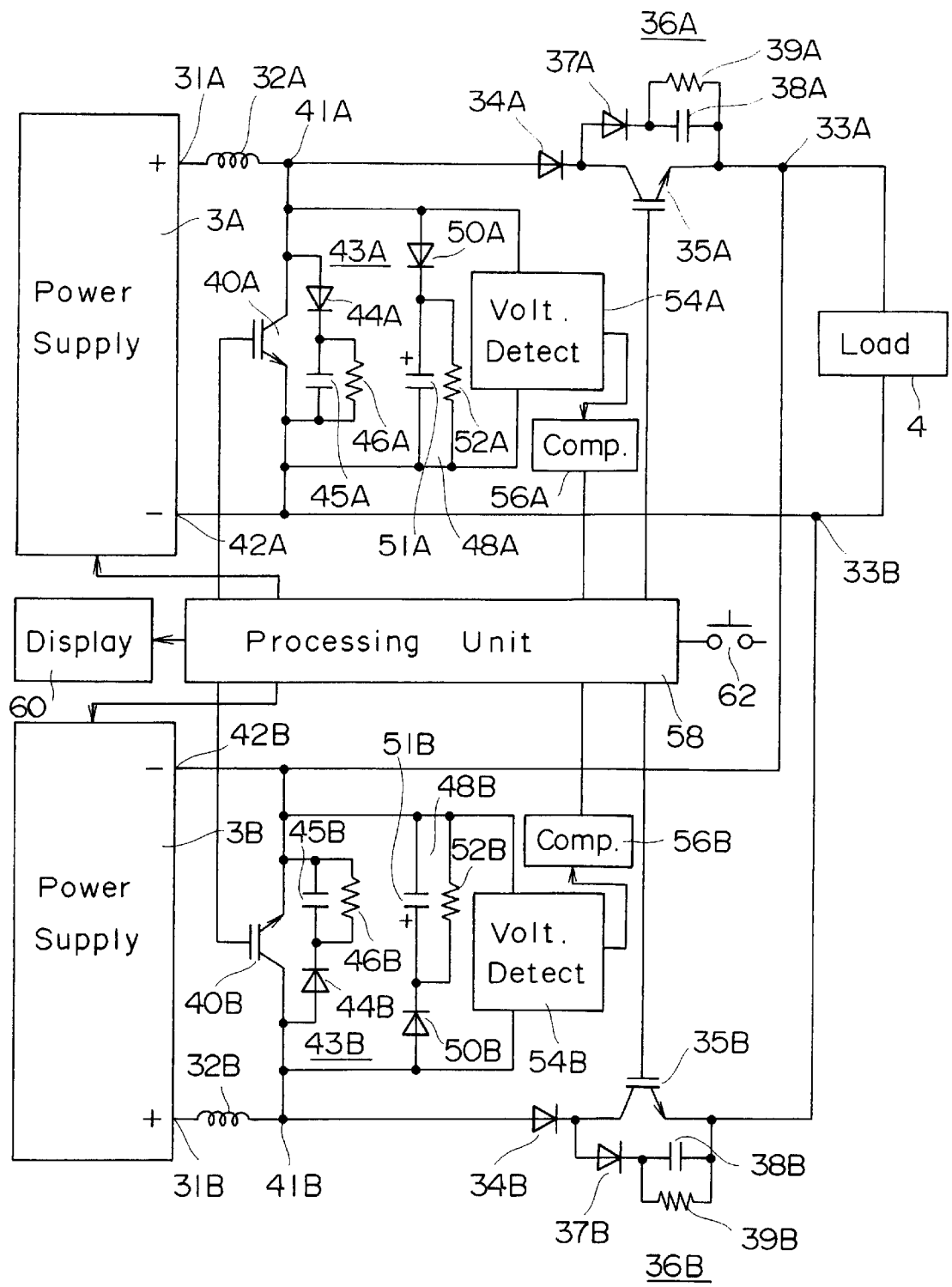
F I G . 2

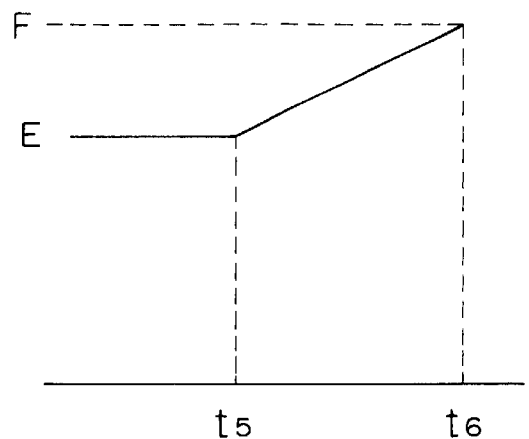
F I G . 4
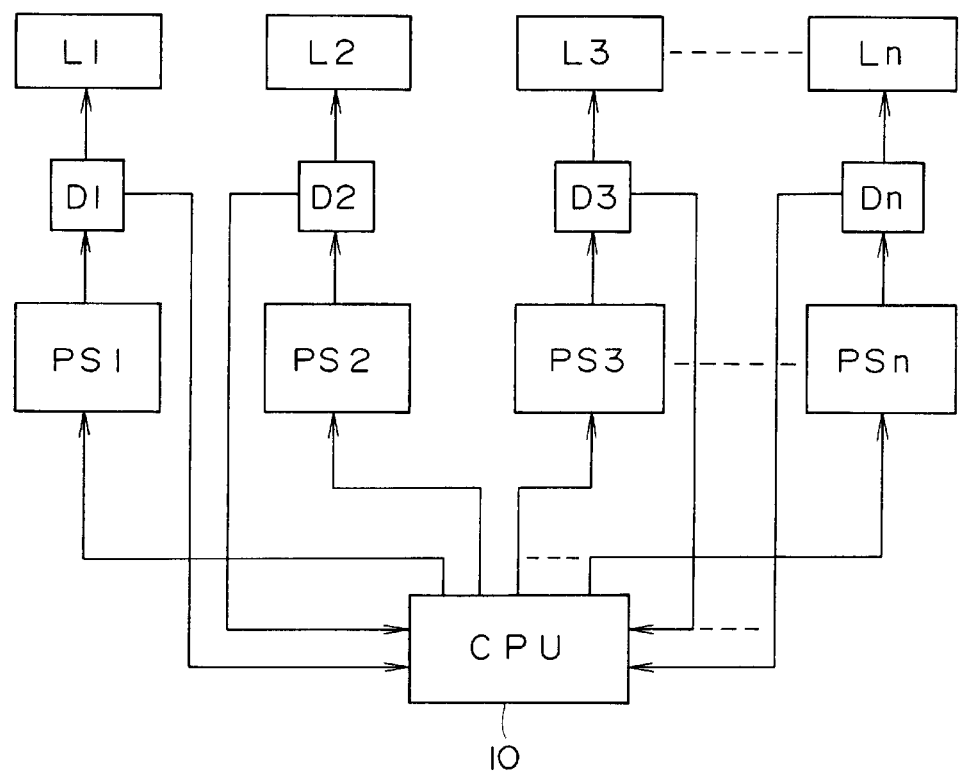
F I G . 5

ELECTROPLATING CURRENT SUPPLY SYSTEM

This invention relates to an electroplating current supply system for electroplating an object to be plated, in which the polarity of current to be supplied to a load (hereinafter referred to as plating load) including the object, an electrolytic solution and electrodes, is inverted at a high speed. More particularly, this invention relates to such electroplating current supply system capable of uniformly plating a printed circuit board with through-holes and via-holes formed therein.

BACKGROUND OF THE INVENTION

It is known to invert, at a high speed, the polarity of current supplied to a plating load. When current with the positive polarity is being supplied to the plating load, plating takes place, and when the current of the negative polarity is being supplied to the load, the plating is interrupted or part of the metal of the plated layer is dissolved back into the electrolyte solution, whereby crystals forming the plated layer are made finer so that the object can be uniformly plated.

When a multi-layered printed circuit board, like the one shown in FIG. 1, including substrates P1, P2, ..., on which electronic components are integrated to a high density, is plated, the thickness of a plated metal layer M on an edge 11 of a through-hole 1 becomes different to a great extent from the thickness on an inner wall 12, as the number of the substrates of the printed circuit board increases. In other words, it is difficult to uniformly plate the printed circuit board as the number of the substrates forming the board increases. The same problem arises with respect to a via-hole 2, so that the thickness of the plated layer M on an edge 21 and the thickness of the layer M on the inner wall 22 become different from each other. It has been found that in order to form a plated metal layer M having a thickness which is uniform over the entire surfaces of the substrates P1, P2, ..., it is necessary to make a negative-polarity plating current of sufficiently larger magnitude to flow for a shorter time period than a positive-polarity plating current, through the through-hole 1 and the via-hole 2.

In Japanese Patent Application No. HEI 10-281954 on Sep. 17, 1998 (Japanese Patent Application Publication No. 2000-92841), inventors including one of the inventors of the present invention proposed an electroplating current supply apparatus which supplies current having a polarity inverted at intervals of, for example, from 5 to 20 milliseconds, to a plating load, to thereby form a layer of uniform thickness over a multi-layered printed circuit board.

When the electroplating current supply apparatus proposed in the above-mentioned Japanese patent application or any other prior art electroplating current supply apparatuses is used to plate a multi-layered printed circuit board like the one shown in FIG. 1 with through-holes and via-holes formed therein, an electroplating current is usually supplied to respective constituent parts of the printed circuit board. It has been found that with such prior art current supply apparatuses, it is difficult to provide a plated layer having a uniform thickness over the entire board. Also, the resulting plated layer is not glossy.

An object of the present invention is to provide an electroplating current supply apparatus with which a multi-layered printed circuit board with through-holes and via-holes formed therein can be plated with a layer of a uniform thickness.

SUMMARY OF THE INVENTION

According to one embodiment of the present invention, an electroplating current supply system has a power supply unit including a DC power supply apparatus supplying a positive current and a DC power supply apparatus supplying a negative current. The positive and negative current supplying DC power supply apparatuses operate alternately with each other so that the power supply unit can supply a plating load with an electroplating current having a polarity inverted at predetermined intervals. The electroplating current supply system further includes a processing unit which controls the ratio between the positive current value of the electroplating current supplied to the plating load from the positive current supplying DC power supply apparatus and the negative current value of the electroplating current supplied to that plating load from the negative current supplying DC power supply apparatus, and also the ratio between the period during which the positive current is supplied to the plating load and the period during which the negative current is supplied to the plating load.

With the electroplating current supply system arranged as described above, a plated layer or coating having a uniform and optimum thickness can be formed on an object by properly controlling, by means of the processing unit, the ratios in magnitude and period of the positive current to the negative current supplied to the plating load.

The ratio in magnitude of the positive current to the negative current to be supplied to the plating load may be selected to be within a range of from 1:2 to 1:3.

The ratio in period of the positive current to the negative current to be supplied to the plating load may be selected to be within a range of from 10:1 to 30:1.

The ratio in magnitude of the positive current to the negative current to be supplied to the plating load may be selected to be within a range of from 1:2 to 1:3, with the ratio in period of the positive current to the negative current selected to be within a range of from 10:1 to 30:1.

According to another embodiment of the invention, an electroplating current supply system has a plurality of current supply units each including a DC power supply apparatus supplying a positive current and a DC power supply apparatus supplying a negative current. The positive and negative current supplying DC power supply apparatuses operate alternately with each other so that each current supply unit can supply an associated plating load with an electroplating current having a polarity inverted at predetermined intervals. The electroplating current supply system further includes a processing unit which controls the ratio between the positive current value of the electroplating current supplied to each plating load from the associated positive current supplying DC power supply apparatus and the negative current value of the electroplating current supplied to that plating load from the associated negative current supplying DC power supply apparatus, and also the ratio between the periods during which the positive and negative currents are supplied to each plating load.

By individually controlling the ratios in magnitude and period of the positive current to the negative current supplied to the respective plating loads, a plated layer having a thickness which is uniform and optimum for each of objects to be plated can be formed on that object.

The ratio in magnitude of the positive current to the negative current to be supplied to each plating load may be selected to be within a range of from 1:2 to 1:3.

The ratio in period of the positive current to the negative current to be supplied to each plating load may be selected to be within a range of from 10:1 to 30:1.

The ratio in magnitude of the positive current to the negative current to be supplied to each plating load may be selected to be within a range of from 1:2 to 1:3, with the ratio in period of the positive current to the negative current selected to be within a range of from 10:1 to 30:1.

The positive current supplying DC power supply apparatus may include a first DC power supply. Between one of the output terminals of the first DC power supply and one of load terminals to which the plating load is to be connected, connected is a series combination of a first reactor and a first main switching device, which switching device is turned on and off in response to a control signal supplied thereto from the processing unit. A first auxiliary switching device is connected between the one and other output terminals of the first DC power supply. The first auxiliary switching device is turned on and off in response to a control signal from the processing unit, in a manner complementary to the manner in which the first main switching device is turned off and on. The other output terminal of the first DC power supply is connected to the other one of the load terminals to which the plating load is to be connected.

The negative current supplying DC power supply apparatus includes a second DC power supply. Between one of the output terminals of the second DC power supply and the other load terminal to which the plating load is to be connected, connected is a series combination of a second reactor and a second main switching device, which switching device is turned on and off in response to the control signal supplied thereto from the processing unit. A second auxiliary switching device is connected between the one and other output terminals of the second DC power supply. The second auxiliary switching device is turned off and on in response to the control signal from the processing unit, in a manner complementary to the manner in which the second main switching device is turned on and off. The other output terminal of the second DC power supply is connected to the one load terminal to which the plating load is to be connected.

BRIEF DESCRIPTION OF THE DRAWINGS

FIG. 2 is a schematic circuit diagram of an electroplating current supply system according to one embodiment of the present invention;

FIG. 4 schematically shows a change of a voltage appearing across an auxiliary switching device when the current supplied to the plating load is interrupted; and FIG. 5 is a block diagram of an electroplating current supply system according to another embodiment of the present invention.

DETAILED DESCRIPTION OF EMBODIMENTS

Figure 1:
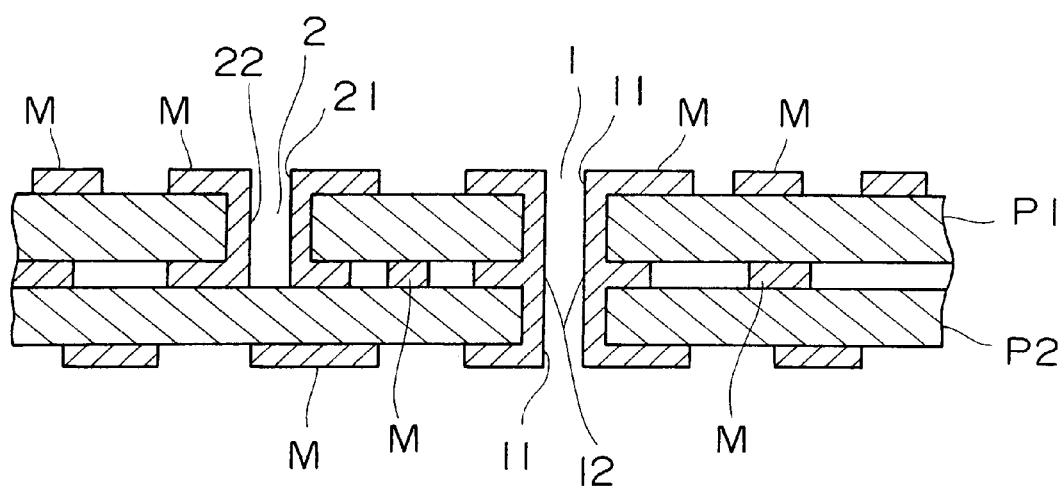
FIG. 1 is a cross-sectional view of an example of a multi-layered printed circuit board shown as an example of an object to be plated.

According to one embodiment of the present invention, an electroplating current supply system (hereinafter sometimes referred to as plating current supply system) includes, as shown in FIG. 2, a power supply unit. The power supply unit includes first and second DC power supply apparatuses. The first and second DC power supply apparatuses include a first DC power supply 3A and a second DC power supply 3B, respectively. Each of the first and second DC power supplies 3A and 3B may be of a type which produces DC power by rectifying ordinary commercial AC power by means of diodes, thyristors or the like, or it may be of a type which produces DC power by rectifying commercial AC power into DC power, converting the DC power into high frequency power by a built-in inverter, and, then, rectifying the high frequency power into DC by a diode. The first and second DC power supplies 3A and 3B operate in such a manner that positive and negative plating currents can be alternately supplied to a load or plating load 4 connected between load terminals 33A and 33B.

The first DC power supply circuit or apparatus supplying a positive current is described, first. A first reactor 32A is connected to one of the output terminals of the first DC power supply 3A, e.g. a positive output terminal 31A. A series combination of a first reverse-current blocking diode 34A and a first switching device, e.g. a first main IGBT, 35A, is connected between the rector 32A and the first load terminal 33A. More specifically, the anode of the reverse-current blocking diode 34A is connected to the reactor 32A, and the cathode is connected to the collector of the IGBT 35A. The emitter of the IGBT 35A is connected to the first load terminal 33A.

The second load terminal 33B is connected to the other, negative output terminal 42A of the first DC power supply 3A. A snubber circuit 36A is connected between the collector and emitter of the first IGBT 35A. The snubber circuit 36A absorbs a high voltage spike developed between the collector and emitter of the IGBT 35A when the IGBT 35A switches from the ON state to the OFF state, to thereby protect the IGBT 35A against the high voltage spike. The snubber circuit 36A includes a series combination of a diode 37A and a snubber capacitor 38A connected between the collector and emitter of the IGBT 35A, and a discharge resistor 39A connected in parallel with the snubber capacitor 38A. A film capacitor having a relatively small capacitance, e.g. 5 $\mu$F or so, is used as the snubber capacitor 38A so that a high-frequency spike voltage can be absorbed. The discharge resistor 39A may have a resistance value of several tens of ohm.

A first auxiliary IGBT 40A acting as a short-circuiting switching device is connected between the junction 41A of the first reactor 32A and the anode of the reverse-current blocking diode 34A and the negative output terminal 42A of the first DC power supply 3A, with the collector of the IGBT 40A connected to the junction 41A and with the emitter connected to the output terminal 42A.

Another snubber circuit 43A is connected between the collector and emitter of the first auxiliary IGBT 40A. The snubber circuit 43A, as the snubber circuit 36A, absorbs a high spike voltage developed between the collector and emitter of the IGBT 40A when it is switched from the ON state to the OFF state, to thereby protect the auxiliary IGBT 40A. The snubber circuit 43A includes a series combination of a diode 44A and a snubber capacitor 45A connected between the collector and emitter of the IGBT 40A, and a discharge resistor 46A connected in parallel with the snubber capacitor 45A. As in the snubber circuit 36A, a film capacitor having a capacitance of, for example, 5 $\mu$F is used as the snubber capacitor 45A, and the discharge resistor 46A may have a resistance value of several tens of ohm.

A first clamping circuit 48A is connected between the collector and emitter of the first auxiliary IGBT 40A, i.e.

between the junction 41A and the negative output terminal 42A of the first DC power supply 3A. The first clamping circuit 48A includes a series combination of a clamping diode 50A and a clamping capacitor 51A. A discharge resistor 52A is connected in parallel with the capacitor 51A, which is an electrolytic capacitor having a capacitance value of, for example, 1000–2000 μF, that is considerably larger than the capacitance of the snubber capacitor 45A of the snubber circuit 43A. The first clamping circuit 48A operates to absorb large energy generated in the reactor 32A when the main IGBT 35A, acting as a switching device, is turned off.

A first voltage detector 54A is connected between the collector and emitter of the first auxiliary IGBT 40A for detecting the voltage between the collector and emitter of the IGBT 40A. A voltage-representative signal representing the voltage detected by the voltage-detector 54A is applied to a first comparator 56A for comparison with a reference value stored in the comparator 56A. When the value of the voltage-representative signal exceeds the reference value, the comparator 56A develops an output signal for application to a processing unit 58, which is described in detail later.

The second DC power supply circuit or apparatus supplying a negative current has substantially the same configuration as the above-described positive current supplying circuit. A second reactor 32B is connected to one output terminal, for example, positive output terminal 31B of the second DC power supply 3B. A series combination of a second reverse-current blocking diode 34B and a second switching device, e.g. second main IGBT, 35B is connected between the reactor 32B and the second load terminal 33B, with the anode of the diode 34B connected to the reactor 32B and with the IGBT 35B connected to the second load terminal 33B as shown in FIG. 2. The other, negative output terminal 42B of the second DC power supply 3B is connected to the first load terminal 33A.

A second snubber circuit 36B, similar to the first snubber circuit 36A, is connected between the collector and emitter of the IGBT 35B. The snubber circuit 36B includes a series combination of a diode 37B and a snubber capacitor 38B, and a discharge resistor 39B connected in parallel with the snubber capacitor 38B. A film capacitor having a relatively small capacitance, e.g. 5 μF or so, is used as the snubber capacitor 38B so that a high-frequency spike voltage can be absorbed. The discharge resistor 39B may have a resistance value of several tens of ohm.

As in the positive current supplying circuit, a short-circuiting switching device, e.g. second auxiliary IGBT 40B is connected between the junction 41B of the second reactor 32B and the anode of the second reverse-current blocking diode 34B, and the other, negative output terminal 42B of the second DC power supply 3B. Another snubber circuit 43B is connected between the collector and emitter of the IGBT 40B. The snubber circuit 43B includes a series combination of a diode 44B and a snubber capacitor 45B, and a discharge resistor 46B connected in parallel with the snubber capacitor 45B.

A second clamping circuit 48B is connected between the collector and emitter of the second auxiliary IGBT 40B, i.e. between the junction 41B and the negative output terminal 42B of the second DC power supply 3B. The second clamping circuit 48B includes a series combination of a clamping diode 50B and a clamping capacitor 51B. A discharge resistor 52B is connected in parallel with the capacitor 51B, which is an electrolytic capacitor having a capacitance value of, for example, 1000–2000 μF. Similar to the first clamping circuit 48A, the second clamping circuit 48B operates to absorb large energy generated in the reactor 32B when the main IGBT 35B is turned off.

A second voltage detector 54B, similar to the first voltage detector 54A, is connected to detect the voltage between the collector and emitter of the second auxiliary IGBT 40B. A voltage-representative signal representing the voltage detected by the voltage-detector 54B is applied to a second comparator 56B for comparison with a reference value stored in the comparator 56B. When the value of the voltage-representative signal exceeds the reference value, the comparator 56B develops an output signal for application to the processing unit 58.

For example, for the positive DC power supply 3A of which rated voltage and current are, for example, 8 V and 500A, respectively, and the negative DC power supply 3B of which rated voltage and current are, for example, 15 V and 1500A, respectively, one device having a rated current of 600 A may be used as the first main IGBT 35A, one device having a rated current of 600 A may be used as the first auxiliary IGBT 40A, a parallel combination of two devices each having a rated current of 600 A may be used as the second main IGBT 35B, and a parallel combination of three devices each having a rated current of 600 A may be used as the second auxiliary IGBT 40B. Semiconductor devices other than IGBTs may be used for the main switching devices 35A, 35B and the auxiliary switching devices 40A and 40B.

When reactors of, for example, 200 μH are used as the reactors 32A and 32B, a film capacitor having 5 μF may be used as the snubber capacitor 45B, and a resistor of several tens of ohm may be used as the discharge resistor 46B.

FIGS. 3A through 3E show waveforms appearing at various portions of the electroplating current supply system shown in FIG. 2.

Figure 3:
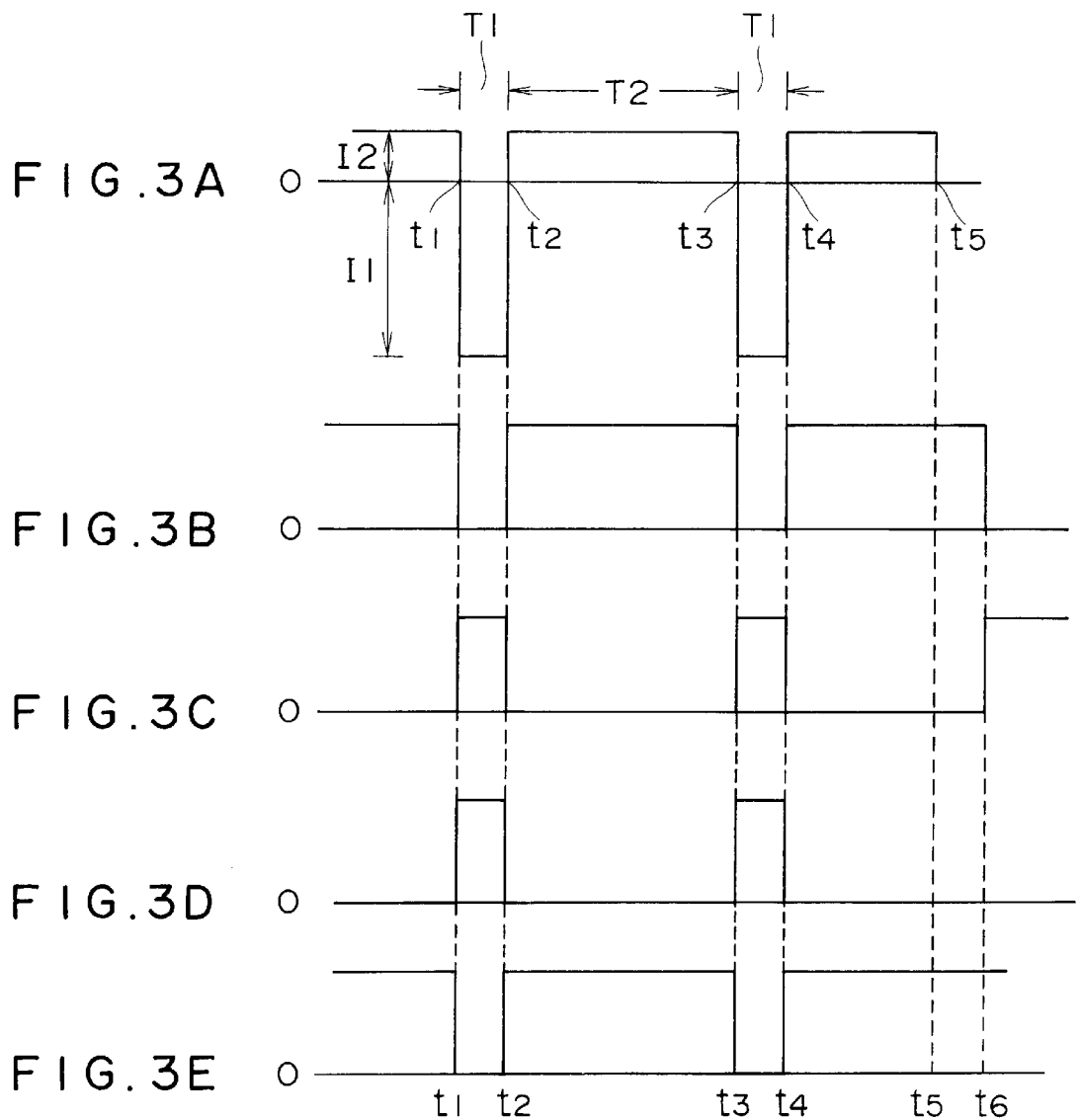
FIG. 3A schematically shows an electroplating current supplied to a plating load from the electroplating current supply system shown in FIG. 2 and FIGS. 3B, 3C, 3D and 3E are schematic representations of signal waveforms coupled to switching devices of the electroplating current supply system shown in FIG. 2.

FIG. 3A shows a waveform of the electroplating current flowing through the plating load 4. FIG. 3B shows a waveform of a gate voltage applied to the gate of the first main IGBT 35A, and FIG. 3C shows a waveform of a gate voltage applied to the gate of the first auxiliary IGBT 40A. The waveform shown in FIG. 3D is of a gate voltage applied to the gate of the second main IGBT 35B, and the waveform shown in FIG. 3E is of a gate voltage applied to the gate of the second auxiliary IGBT 40B. The periods of the gate voltages applied to the respective IGBTs are pre-programmed in the processing unit 58.

Before a time $t_1$ in FIGS. 3A–3E, the first main IGBT 35A receives a positive gate signal shown in FIG. 3B so that it is conductive. A gate signal at the zero (0) level shown in FIG. 3D is applied to the second main IGBT 35B, rendering the IGBT 35B nonconductive. Then, current flows from the first, positive output terminal 31A of the first DC power supply 3A through the first reactor 32A, the first reverse-current blocking diode 34A, the first main IGBT 35A, the first load terminal 33A, the plating load 4, and the second load terminal 33B, to the second output terminal 42A of the first DC power supply 3A. As a result, a positive current I2 shown in FIG. 3A is supplied to the plating load 4 to plate the object. Prior to the time $t_1$, a positive gate signal shown in FIG. 3E is applied to the gate of the second auxiliary IGBT 40B to render the IGBT 40B conductive. Then, current flows from the positive output terminal 31B of the second DC power supply 3B through the second reactor 32B, and the conductive IGBT 40B, to the negative output terminal 42B of the second DC power supply 3B, resulting in storage of energy in the second reactor 32B.

At the time $t_1$, the second main IGBT 35B receives a positive gate signal shown in FIG. 3D and is rendered conductive. The first main IGBT 35A receives a zero (0) level gate signal shown in FIG. 3B and is rendered nonconductive. Then, current flows from the first, positive output terminal 31B of the second DC power supply 3B through the second reactor 32B, the second reverse-current blocking diode 34B, the conductive second main IGBT 35B, the second load terminal 33B, the plating load 4, and the first load terminal 33A to the second, negative output terminal 42B of the second DC power supply 3B. Thus, a negative current I1 shown in FIG. 3A is supplied to the plating load 4. The electroplating current is the sum of the output current of the second DC power supply 3B and the current resulting from discharging of the energy which has been stored in the second reactor 32B until the time $t_1$. Accordingly, the electroplating current rises sharply. This plating current I1 causes interruption of the plating of the plating load 4 or causes re-dissolving of part of the layer which has been deposited on the object.

At the time $t_1$, a positive gate signal shown in FIG. 3C is applied to the gate of the first auxiliary IGBT 40A to render it conductive. Current flows from the positive output terminal 31A of the first DC power supply 3A through the first reactor 32A and the IGBT 40A in the conductive state to the negative output terminal 42A of the first DC power supply 3A, whereby energy is stored in the first reactor 32A.

At a time $t_2$, a zero (0) level gate signal shown in FIG. 3D is applied to the second main IGBT 35B to turn off the IGBT 35B, whereas the first main IGBT 35A receives a positive gate signal shown in FIG. 3B, whereby it is rendered conductive. As in the state prior to the time $t_1$, a positive plating current I2 shown in FIG. 3A flows from the positive output terminal 31A of the first DC power supply 3A through the first reactor 32A, the first reverse-current blocking diode 34A, the first main IGBT 35A, the first load terminal 33A, the plating load 4 and the second load terminal 33B to the second output terminal 42A of the first DC power supply 3A, whereby the object is plated. In this case, too, current due to the discharge of the energy stored in the first reactor 32A during the time period of from $t_1$ to $t_2$ is added to the current I2, so that I2 rises sharply.

At the time $t_2$, a positive gate signal shown in FIG. 3E is applied to the second auxiliary IGBT 40B to render it conductive, so that energy is stored in the second reactor 40B.

In a similar manner, the second main IGBT 35B and the first main IGBT 35A are turned on and off at a high speed, with the first and second auxiliary IGBTs 40A and 40B turned on and off at the high speed, too, which results in application of the electroplating current having its polarity sharply inverted at predetermined intervals at a high speed to the plating load 4 so that the object can be plated.

As stated previously, the ratio T2/(T1+T2), where T2 is the period during which the positive current I2 flows to plate the object, and T1 is the period during which the negative current I1 flows to interrupt the plating or to cause the material deposited on the object to dissolve back into the electrolyte, is controlled by the processing unit 58. The magnitudes I1 and I2 of the current flowing through the plating load 4 may be determined by appropriately determining the electric capacity of each of the DC power supplies 3B and 3A. Alternatively, although not shown, the processing unit 58 may be arranged to control the magnitudes of the positive and negative currents flowing through the plating load 4 in accordance with a current-representative signal prepared by detecting the respective currents.

To give an example, a high-quality coating of uniform thickness was obtained when the positive plating current I2 was 100 A, the negative plating current I1 was 250 A, the period T2 during which the positive plating current flowed was 10 milliseconds, and the period T1 during which the negative plating current flowed was 0.5 milliseconds.

Interruption of the supply of the positive plating current I2 to the plating load 4 from the first DC power supply 3A at, for example, a time $t_5$ for some reason is considered.

The clamping capacitor 51A of the first clamping circuit 48A is charged to a voltage E shown in FIG. 4 by the time $t_5$ due to the current flowing from the positive output terminal 31A of the first DC power supply 3A through the first reactor 32A and the diode 50A in the clamping circuit 48A to the negative output terminal 42A of the first DC power supply 3A.

When the current flowing through the first reactor 32A is interrupted for any reasons, such as disconnection of the object from a hanger through which current is applied to the object, a voltage larger than the voltage E (FIG. 4) is developed across the collector-emitter path of the first auxiliary IGBT 40A. The energy stored on the first reactor 32A is absorbed by the clamping capacitor 51A, and, therefore, the rate of increase of the voltage applied between the collector and emitter of the first auxiliary IGBT 40A is small. Therefore it never occurs that the first auxiliary IGBT 40A is damaged by this voltage. As the voltage across the collector-emitter of the first auxiliary IGBT 40A rises due to the first reactor 32A and wiring reactance, as illustrated in FIG. 4, the first voltage detector 54A detects it. The voltage detector 54A develops a voltage-representative signal representing the detected voltage, and the voltage-representative signal is compared with the reference value in the first comparator 56A.

When the voltage across the collector-emitter path of the first auxiliary IGBT 40A reaches a value F shown in FIG. 4 at a time $t_6$, the value of the voltage-representative signal from the first voltage detector 54A exceeds the reference value, which causes the first comparator 56A to provide an output signal to the processing unit 58. In response to the output signal from the first comparator 56A, the processing unit 58 provides a zero (0) level gate signal to the first main IGBT 35A to render it nonconductive at the time $t_6$, as shown in FIG. 3B, and also provides a gate signal to the gate of the first auxiliary IGBT 40A to render it conductive as shown in FIG. 3C. Because of the turning off and on of the first main IGBT 35A and the first auxiliary IGBT 40A, respectively, by the gate signals, the energy stored in the first reactor 32A is returned through the first auxiliary IGBT 40A to the first DC power supply 3A. In this way, no high voltage is applied to the first auxiliary IGBT 40A, and the IGBT 40A is protected.

As for the second auxiliary IGBT 40B, a positive gate signal is continuously applied to it as shown in FIG. 3E, so that the IGBT 40B is maintained conductive. After the energy in the first reactor 32A is returned through the first auxiliary IGBT 40A to the first DC power supply 3A, the processing unit 58 applies an OFF command signal to the DC current supplies 3A and 3B to stop their operation. This causes current to flow through neither the first and second reactors 32A and 32B nor the first and second auxiliary IGBTs 40A and 40B, and, therefore, they are also protected.

A display device 60, in response to a signal from the processing unit 58, notifies an operator that the circuit including the plating load 4 has been opened, which makes him investigate the cause for it. A reset switch 62 shown in FIG. 2 is used to re-start the system after the recovery from the failure.

The embodiment shown in FIG. 2 includes the reverse-current blocking diodes 34A and 34B connected between the first reactor 32A and the collector of the first main IGBT 35A and between the second reactor 32B and the collector of the second main IGBT 35B, respectively. However, since the first and second DC power supplies 3A and 3B include rectifying diodes, the reverse-current blocking diodes 34A and 34B may be eliminated.

FIG. 5 shows an electroplating current supply system according an embodiment of the present invention for supplying a plating current to a plurality of plating loads.

In FIG. 5, each of plating loads L1, L2, L3, . . . , Ln corresponds to the plating load 4 shown in FIG. 4, and includes an object to be plated, an electrolyte solution, electrodes etc. The system shown in FIG. 5 further includes a plurality of power supply units PS1, PS2, PS3, . . . , PSn, each supplying an electroplating current. Each of the power supply units is similar to the one shown in FIG. 2, but does not include the plating load 4 and the processing unit 58. Each of the power supply units PS1, PS2, PS3, . . . , PSn supplies an plating current to its associated plating load L1, L2, L3, . . . , or Ln through an associated one of plating current detectors D1, D2, D3, . . . , Dn.

The system includes further a processing unit 10 including a CPU. The processing unit 10, in responsive to signals supplied by the current detectors D1–Dn, representing the magnitudes of the plating currents and the periods during which the plating currents are supplied, supplies control signals to the respective plating current supplying power supply units PS1–PSn, to individually control the magnitudes of the negative currents (dissolving currents) I1 and the positive currents (plating currents) I2, and the periods T1 and T2 during which the negative and positive currents flow to the respective plating loads L1–Ln so that the respective objects can be optimally plated. The magnitudes of the currents I1 and I2 and the periods during which the currents I1 and I2 flow are empirically and experimentally determined for forming optimum coatings on different types of objects, and programmed in the processing unit 10.

When the ratio of the positive current I2 to the negative current I1 (FIG. 3A) is smaller than 1:2, e.g. 1:1.5, the positive current I2 is too much larger than the negative current I1. In such a case, the inner wall 12 of the through-hole 1 and the inner wall 22 of the via-hole 2 of the printed circuit board shown in FIG. 1 are insufficiently plated relative to the edges 11 and 21. Thus, the thickness of the plated coating on the inner walls 12 and 22 is smaller than the thickness of the coating on the edges 11 and 21. In other words, the resulting plated coating cannot have a uniform thickness.

On the other hand, if the ratio of I2 to I1 is larger than 1:3, e.g. 1:4, the negative current I1 is too much larger than the positive current I2. Then, while the inner wall 12 of the through-hole 1 and the inner wall 22 of the via-hole 2 are plated, a large amount of the plated coating on the edges 11 and 21 is re-dissolved into the electrolyte solution, which results in insufficient plating of the edges 11 and 21. In this case, too, the thickness of the plated coating is not uniform. In this case, there is another disadvantage that an additive to the electrolyte solution is consumed very fast, and, therefore, it is necessary to frequently replenish the electrolyte solution with the additive.

It has been discovered that with the ratio of the magnitude I2 of the positive current to the magnitude I1 of the negative current being within a range of from 1:2 to 1:3, the difference in thickness of the plated coatings between the edges 11 and 21 and the inner walls 12 and 22 is smallest, resulting in a substantially uniform coating thickness, small consumption of the additive in the electrolyte solution, and increase of productivity.

Next, the period T2 during which the positive current I2 is supplied and the period T1 during which the negative current is supplied are considered. With the ratio of T2 to T1 being larger than 30:1, the period T2 is too much longer than the period T1, and, therefore, while the edges 11 and 21 are plated sufficiently, the plating of the inner walls 12 and 22 is insufficient. In other words, the plated coating on the inner walls 12 and 22 is thinner than the coating on the edges 11 and 21, and, therefore, the coating thickness is not uniform.

If the ratio of T2 to T1 is smaller than 10:1, the plated coating on the edges 11 and 21 is too much dissolved back into the electrolyte solution, and, since the period T2 during which the positive current flows in one cycle is short, the time required for the plating as a whole becomes longer.

It has been found that the difference between the thickness of the coating on the edges 11 and 21 and the thickness of the coating on the inner walls 12 and 22 is smallest when the ratio of T2 to T1 is within a range of from 10:1 to 30:1, which results in uniform thickness of the plated coating.

Also, it has been found that when the ratio in magnitude of the positive current I2 to the negative current I1 is set to be within a range of from 1:2 to 1:3, with the ratio in duration of the positive current I2 to the negative current I1 being set to be within a range of from 10:1 to 30:1, objects can be plated with coatings of the most uniform thickness in the least time with less consumption of the additive.

What is claimed is:

1. An electroplating current supply system comprising:
a power supply unit including a first DC power supply apparatus supplying a positive current and a second DC power supply apparatus supplying a negative current, for supplying a plating load with an electroplating current the polarity of which is inverted at predetermined intervals; and
a processing unit for controlling the ratio of a positive current value of said electroplating current supplied to said plating load from said first DC power supply apparatus to a negative current value of said electroplating current supplied to said plating load from said second DC power supply apparatus, and the ratio of a period during which said positive current is supplied to said plating load to a period during which said negative current is supplied to said plating load;
wherein:
said first DC power supply apparatus includes a first DC power supply and a first main switching device coupled between one output of said first DC power supply and one load terminal adapted to be coupled to said plating load, said first main switching device being turned on and off in response to a first control signal provided thereto from said processing unit, the other output of said first DC power supply being connected to the other load terminal adapted to be coupled to said plating load;
said second DC power supply apparatus includes a second DC power supply and a second main switching device coupled between one output of said second DC power supply and said other load terminal, said second main switching device being turned on and off in response to a second control signal provided thereto from said processing unit, the other output of said second DC power supply being coupled to said one load terminal; and said processing unit provides said first and second control signals in such a manner that said first and second main switching devices can be turned on alternatively.

2. The electroplating current supply system according to claim 1 wherein said processing unit sets the ratio in magnitude of said positive current supplied by said first DC power supply apparatus to said negative current supplied by said second DC power supply apparatus to be within a range of from 1:2 to 1:3.

3. The electroplating current supply system according to claim 1 wherein said processing unit sets the ratio in period of said positive current supplied by said first DC power supply apparatus to said negative current supplied by said second DC power supply apparatus to be within a range of from 10:1 to 30:1.

4. The electroplating current supply system according to claim 1 wherein said processing unit sets the ratio in magnitude of said positive current supplied by said first DC power supply apparatus to said negative current supplied by said second DC power supply apparatus to be within a range of from 1:2 to 1:3, and also sets the ratio in period of said positive current to said negative current to be within a range of from 10:1 to 30:1.

5. The electroplating current supply system according to claim 1 wherein a plurality of said power supply units are provided for respective ones of a plurality of plating loads; and said processing unit is common to all of said power supply units.

6. The electroplating current supply system according to claim 5 wherein said processing unit sets the ratio in magnitude of said positive current supplied to each plating load by said first DC power supply apparatus to said negative current supplied to that plating load by said second DC power supply apparatus to be within a range of from 1:2 to 1:3.

7. The electroplating current supply system according to claim 5 wherein said processing unit sets the ratio in period of said positive current supplied to each plating load by said first DC power supply apparatus to said negative current supplied to that plating load by said second DC power supply apparatus to be within a range of from 10:1 to 30:1.

8. The electroplating current supply system according to claim 5 wherein said processing unit sets the ratio in magnitude of said positive current supplied to each plating load by said first DC power supply apparatus to said negative current supplied to that plating load by said second DC power supply apparatus to be within a range of from 1:2 to 1:3, and also sets the ratio in period of said positive current to said negative current to be within a range of from 10:1 to 30:1.

9. An electroplating current supply system comprising:
a power supply unit including a first DC power supply apparatus supplying a positive current and a second DC power supply apparatus supplying a negative current, for supplying a plating load with an electroplating current the polarity of which is inverted at predetermined intervals; and
a processing unit for controlling the ratio of a positive current value of said electroplating current supplied to said plating load from said first DC power supply apparatus to a negative current value of said electroplating current supplied to said plating load from said second DC power supply apparatus, and the ratio of a period during which said positive current is supplied to said plating load to a period during which said negative current is supplied to said plating load;
wherein said first DC power supply apparatus comprises:
a first DC power supply;
a series combination of a first reactor and a first main switching device connected between one output of said first DC power supply and one load terminal adapted to be coupled to a plating load, said first main switching device being turned on and off in response to a control signal provided thereto from said processing unit; and
a first auxiliary switching device connected between said one and other outputs of said first DC power supply, said first auxiliary switching device being turned off and on in response to a control signal provided thereto from said processing unit in a manner complementary to the turning on and off of said first main switching device;
said other output of said first DC power supply being connected to the other load terminal adapted to be coupled to said plating load; and
wherein said second DC power supply apparatus comprises:
a second DC power supply;
a series combination of a second reactor and a second main switching device connected between one output of said second DC power supply and said other load terminal, said second main switching device being turned on and off in response to a control signal provided thereto from said processing unit; and
a second auxiliary switching device connected between said one output and other outputs of said second DC power supply, said second auxiliary switching device being turned off and on in response to a control signal provided thereto from said processing unit in a manner complementary to the turning on and off of said second main switching device;
said other output of said second DC power supply being connected to said one load terminal adapted to be coupled to said plating load.

* * * * *